(12) United States Patent
Tang et al.

(10) Patent No.: US 7,088,132 B1
(45) Date of Patent: Aug. 8, 2006

(54) CONFIGURING FPGAS AND THE LIKE USING ONE OR MORE SERIAL MEMORY DEVICES

(75) Inventors: Howard Tang, Cupertino, CA (US); Satwant Singh, Fremont, CA (US); Ann Wu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/243,255

(22) Filed: Oct. 4, 2005

Related U.S. Application Data

(63) Continuation of application No. 10/809,658, filed on Mar. 25, 2004.

(51) Int. Cl.
*H03K 19/177* (2006.01)

(52) U.S. Cl. ............... 326/39; 326/40; 365/185.33; 365/185.29

(58) Field of Classification Search ............... 326/39; 365/185.29, 185.33
See application file for complete search history.

(56) References Cited

U.S. PATENT DOCUMENTS

| | | | |
|---|---|---|---|
| 5,794,033 A | 8/1998 | Aldebert | |
| 6,038,185 A | 3/2000 | Ng et al. | |
| 6,044,025 A * | 3/2000 | Lawman | 365/191 |
| 6,564,285 B1 * | 5/2003 | Mills et al. | 711/103 |
| 6,785,165 B1 | 8/2004 | Kawahara | |
| 6,903,574 B1 * | 6/2005 | Chen et al. | 326/41 |
| 2004/0061147 A1 | 4/2004 | Fujita | |

OTHER PUBLICATIONS

U.S. Appl. No. 10/809,658, Tang.
"JTAG & In-System Programmability," MAX II Device Handbook, Dec. 2004, vol. 1, Chapter 3, Altera Corporation.
"FPGA Configuration EEPROM Memory 3.3V and 5V System Support" Datasheet, Rev. 2321E-CNFG-Jun. 2003, pp. 1-23, Atmel Corporation.
Altera Corporation, press release of Sep. 30, 2002, "Altera Introduces Industry's Lowest Cost Configuration Device Famy".
Altera Corporation, Cyclone Device Handbook, vol. 1, Chapters 13-14 May-Oct. 2003.

* cited by examiner

*Primary Examiner*—Vibol Tan

(57) ABSTRACT

The configuration architecture for a programmable device, such as an FPGA, includes one or more memory devices connected directly to the FPGA such that the FPGA can be configured with configuration data stored in the memory devices without transmitting the configuration data via a controller connected between any of the memory devices and the FPGA. In one embodiment, the FPGA has an Serial Peripheral Interface (SPI) that is connected to the SPI interface of each of one or more SPI serial flash PROMs operating as boot PROMs. When there are two or more boot PROMs, each PROM stores a portion of the FPGA's configuration data and the FPGA interleaves the data from multiple boot PROMs to generate a serial configuration data bitstream. The present invention enables boot PROMs having different sizes and/or storing different amounts of configuration data to be simultaneously connected to an FPGA to support efficient configuration architectures.

37 Claims, 7 Drawing Sheets

CONFIGURING FPGAS AND THE LIKE USING ONE OR MORE SERIAL MEMORY DEVICES

RELATED APPLICATION DATA

This application is a continuation of application Ser. No. 10/809,658, filed Mar. 25, 2004 is allowed.

TECHNICAL FIELD

The present invention relates to programmable devices, such as field-programmable gate arrays (FPGAs), and, in particular, to techniques for configuring such devices using external memory devices.

BACKGROUND

Volatile programmable devices, such as FPGAs, typically rely on external storage media to hold the bitstreams used to configure the devices. For example, programmable read-only memory (PROM) devices are often used to hold the configuration bitstreams for FPGAs. Such devices are referred to as "boot PROMs," because they are used to boot (i.e., initialize) programmable devices, such as volatile FPGAs.

FIG. 1 shows a block diagram of one conventional architecture for configuring an FPGA 102 in which a parallel PROM device 104 is used as the boot PROM. As shown in FIG. 1, for a typical FPGA having about 8 million bits of configuration data, a (disadvantageously large) total of 29 FPGA pins are dedicated to this configuration architecture (i.e., 1 pin for the chip select signal (/CS), one pin for the configuration clock signal (SCLK), eight pins for data, and 19 pins for addressing). Another disadvantage of this solution is the relatively large package size of parallel PROMs, which require a relatively larger amount of PCB board space.

FIG. 2 shows a block diagram of another conventional architecture for configuring an FPGA 202 using a parallel PROM 204 as the boot PROM, in which a controller 206 (e.g., a complex programmable logic device (CPLD) or a micro-controller) provides an interface between the parallel PROM and the FPGA. In order to reduce the number of pins consumed on the FPGA, controller 206 handles the addressing into PROM 204 and converts the parallel data received from PROM 204 into serial data for transmission to FPGA 202 via a single FPGA pin (DIN).

FIG. 3 shows a block diagram of yet another conventional architecture for configuring an FPGA 302, in this case, using a serial PROM 304 as the boot PROM, where a micro-controller 306 forms the interface between the PROM and the FPGA. In one possible implementation, serial PROM 304 is a non-volatile serial flash PROM that interfaces with an industry-standard Serial Peripheral Interface (SPI) on micro-controller 306.

Although these controller-based solutions of FIGS. 2 and 3 reduce the number of FPGA pins consumed, they do so at the increased cost of having to provide two chips to configure an FPGA: one chip for the memory device and one chip for the controller.

Companies, such as Atmel Corporation of San Jose, Calif., manufacture serial PROM devices as FPGA configuration devices that interface directly to FPGAs (i.e., without an intermediary controller); however, these non-standard serial PROMs are proprietary and therefore typically more expensive than standard serial PROMs.

SUMMARY

Problems in the prior art are addressed in accordance with the principles of the present invention by architectures for configuring a programmable device, such as a volatile FPGA, using one or more standard memory devices (e.g., SPI serial flash PROMS) to store and provide the configuration data to the programmable device, without transmitting the configuration data via an intermediary controller connected between the programmable device and the memory device(s).

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Single PROM Architecture

Figure 4:
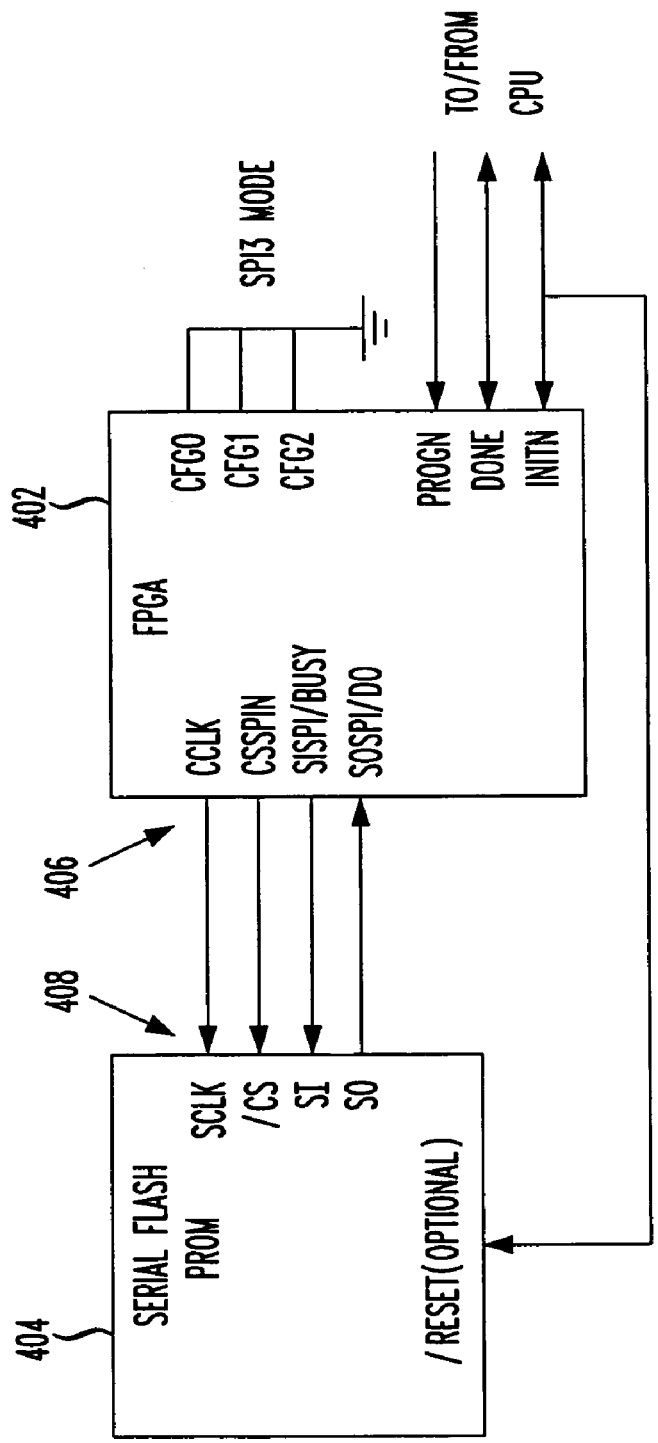
FIG. 4 shows a block diagram of an architecture for configuring an FPGA, according to one embodiment of the present invention.

FIG. 4 shows a block diagram of an architecture for configuring an FPGA 402, according to one embodiment of the present invention. As shown in FIG. 4, a conventional SPI serial flash PROM device 404 is used as the boot PROM, where SPI interface 408 of PROM 404 is connected directly to an SPI interface 406 implemented within FPGA 402. As understood by those skilled in the art, a Serial Peripheral Interface (SPI) conforms to an industry standard specified by Motorola Corporation of Schaumburg, Ill. In a preferred implementation, SPI interface 406 of FPGA 402 is implemented using dedicated circuitry, although, in alternative implementations, the SPI interface could be implemented—at least partially or even entirely—using the FPGA's programmable logic.

In addition to the connections between PROM 404 and FPGA 402, the architecture of FIG. 4 shows a number of connections (1) between a central processing unit (CPU) (or other external controller) (not shown in FIG. 4) and the FPGA (e.g., at the PROGN, DONE, and INITN pins) and (2)

between the CPU and the PROM (e.g., at the /RESET pin). These connections are used for high-level control (e.g., start, suspend, resume, stop) over the process of configuring the FPGA (also referred to as the "boot cycle").

The following list defines the signals transmitted via the labeled pins on PROM 404 used in the architecture of FIG. 4:

| | |
|---|---|
| /CS: | Chip select signal, received from the FPGA, used to enable the PROM to receive the read command and the starting address and to read out configuration command and data after the read command is received. |
| SCK: | Configuration clock signal, received from the FPGA, used to control the timing of reading serial configuration data out from the PROM. |
| SI: | Tristate input signal, received from the FPGA. Return-to-zero (RZ) high and low levels indicate bit values "1" and "0", respectively, of the command, then the starting address of the configuration data. |
| SO: | Upon receiving the read command and starting address on the SI pin, serial output signal used to transmit a serial stream of stored configuration command and data to the FPGA. This is also a tristate signal, where high and low levels indicate bit values "1" and "0", respectively, and the tristated condition indicates no data. |
| /RESET: | (Optional) reset signal, received from the CPU or FPGA, used to re-initialize the PROM to the beginning of the configuration data. |

The following list defines the signals transmitted via the labeled pins on FPGA 402 used in the architecture of FIG. 4:

| | |
|---|---|
| CSSPIN: | Chip select signal sent to the /CS pin of the PROM. |
| CCLK: | Configuration clock signal sent to the SCK pin of the PROM. |
| SISPI/BUSY: | Read command and starting address/busy signal sent to the SI pin of the PROM. |
| SOSPI/D0: | "Data in" signal received from the SO pin of the PROM. |
| PROGN: | "Boot on" signal, received from the CPU, used to inform the FPGA that a boot cycle is beginning. |
| DONE: | Used by the FPGA to indicate that the boot cycle is complete and successful. |
| INITN: | Used by the FPGA to indicate that the boot cycle is to begin and complete with success. |
| CFG0–2: | Three-bit configuration mode selection signal CFG, used to select one of the eight possible configuration options supported by the FPGA. The configuration modes include: |
| | SPI03 mode: The FPGA sends the 8-bit read command opcode 00000011 (03 in hexadecimal) to the SI pin of the SPI PROM. The opcode 03 is said to be hardwired inside the FPGA. Certain SPI PROMs manufactured by STMicro-electronics NV expect the read command opcode to be 03. |
| | SPIX mode: The FPGA reads the 8-bit read command opcode from the D0 . . . D7 pins of the FPGA and then sends the opcode to the SI pin of the SPI PROM. This mode is selected if the 8-bit read command opcode of the SPI PROM is 03 or any others. The read opcode is user programmable. The SPI PROM manufactured by ATMEL Corp. expects the read command opcode to be 01101000 (68 in hexadecimal). |

Figure 1:
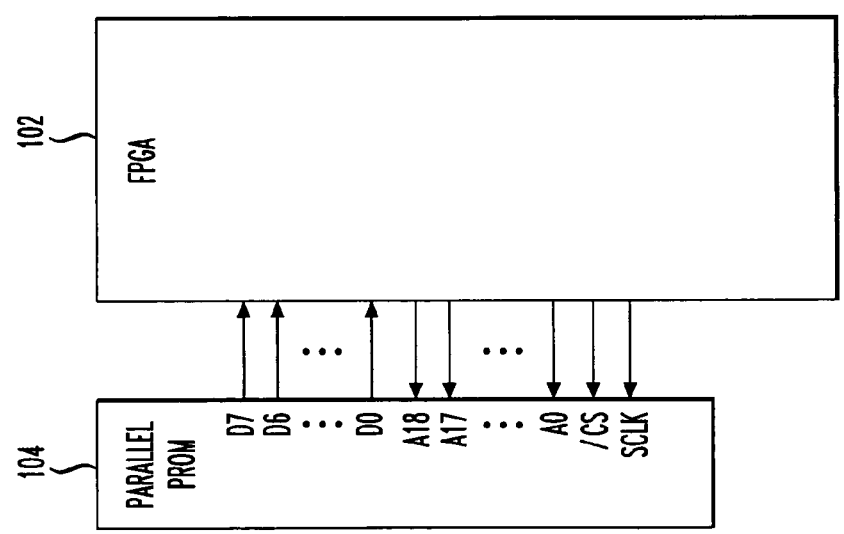
FIG. 1 shows a block diagram of one conventional architecture for configuring an FPGA in which a parallel PROM device is used as the boot PROM.
Figure 2:
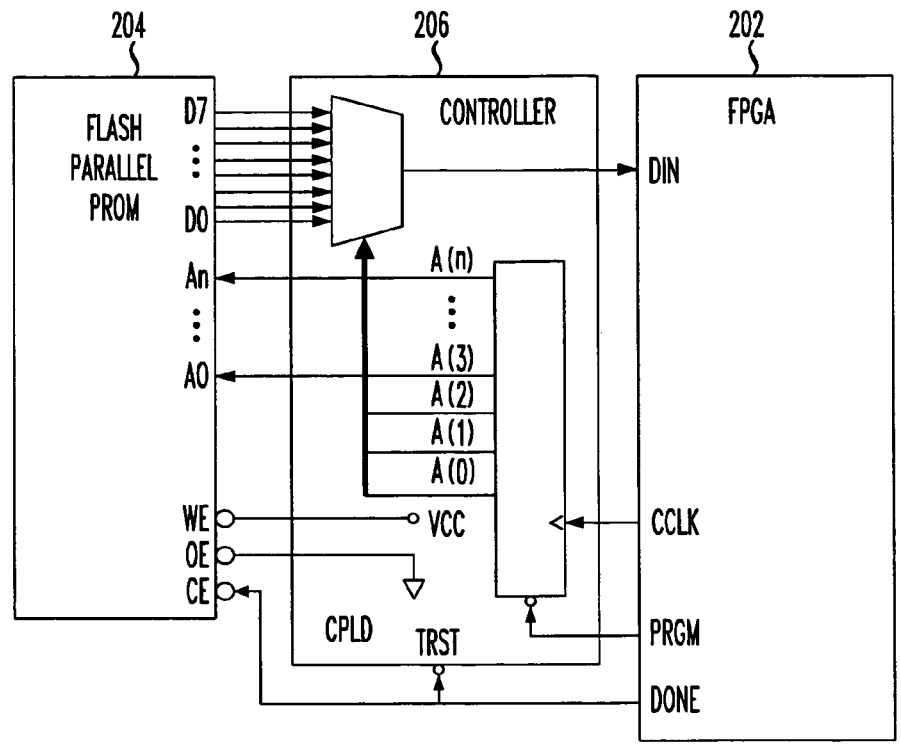
FIG. 2 shows a block diagram of another conventional architecture for configuring an FPGA using a parallel PROM as the boot PROM, in which a controller provides an interface between the PROM and the FPGA.
Figure 3:
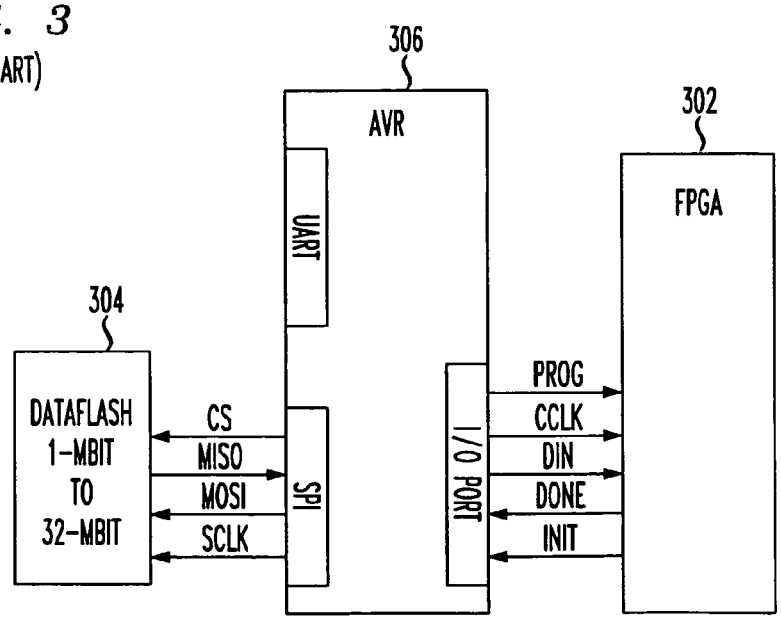
FIG. 3 shows a block diagram of yet another conventional architecture for configuring an FPGA, in this case, using a serial PROM as the boot PROM, where a micro-controller forms the interface between the PROM and the FPGA.

In the prior art architectures of FIGS. 2–3, the FPGA operated as a slave device during the boot cycle in that the FPGA only received commands and did not generate any commands for the memory device while performing configuration. As implied by the pin definitions listed above, however, in addition to being able to receive boot commands and data (e.g., via the PROGN, DONE, and INIT pins), FPGA 402 of the present invention is also capable of independently generating (e.g., without relying on the CPU) boot commands for the PROM, such as the read command and the starting address (e.g., via the SISPI/BUSY and CSSPIN pins) or instructions to begin to read data from all of the boot PROMs. To this extent, the FPGA operates as a master device, at least relative to the PROM. When the PROM receives the read command and the starting address, the SO pin is changed from tri-state to the enable state in order to read out the configuration command and data stored in the device. It is presented to SO per each SCLK clock.

Figure 5:
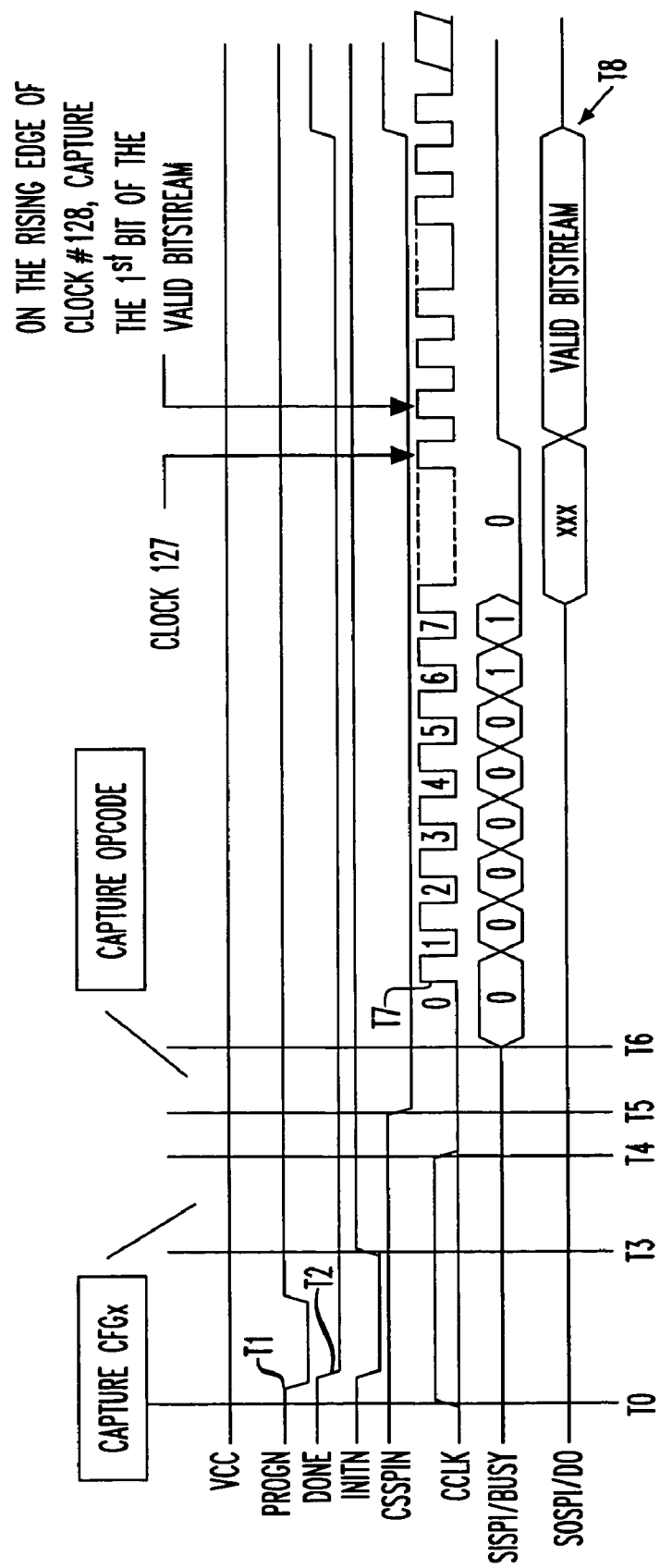
FIG. 5 shows a signal timing diagram for a boot cycle for the architecture of FIG. 4.

FIG. 5 shows a signal timing diagram for a boot cycle for the architecture of FIG. 4. During the entire timing diagram, VCC (not shown in FIG. 4) is high, indicating that the FPGA is powered on. At time T1, the CPU makes PROGN, an active-low signal, low to instruct the FPGA that a boot cycle is beginning. Soon after, at time T2, the FPGA makes (1) DONE low (indicating that the boot cycle is not yet complete) and (2) (active-low signal) INITN temporarily low (instructing the PROM to reset its pointer to the beginning of the stored configuration data).

From the time that the FPGA makes INITN high again at time T3 until time T4, the FPGA is able to capture the configuration mode CFG, which in this case is (000) indicating that the FPGA is set up into the SPI03 configuration mode (e.g., the read opcode 03 will be send to the SPI PROM).

During the interval from time T0 to time T4, the status of CCLK is irrelevant, as indicated by shading. At time T4, the FPGA makes CCLK low. At time T5, the FPGA makes (active-low signal) CSSPIN low, enabling the PROM to be ready to receive commands from the FPGA and then transfer configuration command and data to the FPGA.

At time T6, the FPGA begins to send the read command and then the starting address on the SISPI/BUSY pin, and, soon after, at time T7, the FPGA starts to generate the configuration clock signal CCLK (starting at clock cycle 0) using a default clock rate (e.g., based on a clock internal to the FPGA). During the first eight clock cycles (i.e., labeled 0 to 7), the FPGA uses SISPI/BUSY to send to the PROM the read command opcode, followed by the starting address of the configuration data in the PROM.

From clock cycle #8 through clock cycle #127, the PROM transfers configuration overhead data to the FPGA via SOSPI/D0. The FPGA ignores this over-head (dummy data) to give the PROM device ample time to switch from tri-state to the enable state and begin presenting valid configuration command and data on the SO pin of the PROM device.

At the end of clock cycle #127, the PROM, having exhausted the dummy data, begins to transfer valid configuration command and data one bit at a time to the FPGA via SOSPI/D0. The transfer of configuration command and data continues until all of the data has been read (at time T8), at which time the FPGA makes (1) DONE high (informing the CPU that the boot cycle is complete) and (2) CSSPIN high (disabling the PROM from sending any more configuration data). From then on, the value of the configuration clock CCLK is again irrelevant, as indicated by shading.

Multiple PROM Architecture

Figure 6:
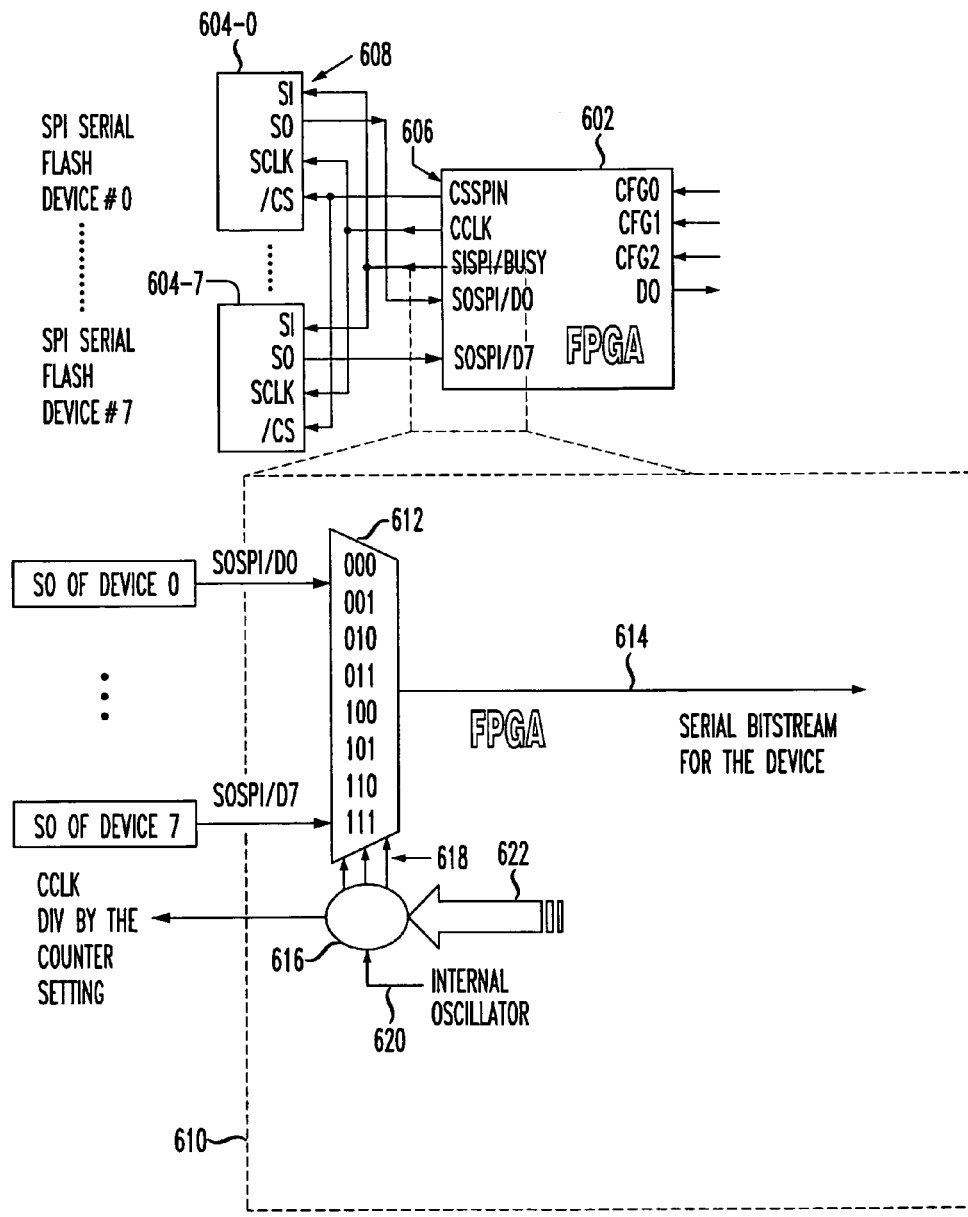
FIG. 6 shows a block diagram of an architecture for configuring an FPGA, according to another embodiment of the present invention.

FIG. 6 shows a block diagram of an architecture for configuring an FPGA 602, according to another embodiment of the present invention. As shown in FIG. 6, FPGA 602 is connected to a stack of eight different SPI serial flash PROM devices 604-0 to 604-7.

In particular, the SPI interface 608 of each boot PROM 604 is connected to SPI interface 606 of FPGA 602, where SPI interface 606 has eight different "data in" pins SOSPI/D0 to SOSPI/D7, each of which is connected to the SO pin of one of the eight PROMs, while each of the CSSPIN, CCLK, and SISPI/BUSY pins of FPGA 602 is simultaneously connected to the /CS, SCLK, and SI pins, respectively, of all eight PROMs. The definitions of these pins are analogous to the pin definitions given above for the architecture of FIG. 4. Although not shown in FIG. 6, FPGA 602 also has pins analogous to the PROGN, DONE, and INITN pins of FPGA 402 of FIG. 4, and each PROM 604 has an optional pin analogous to the /RESET pin of PROM 404 of FIG. 4.

In FIG. 6, the three configuration mode pins CFG0–2 are not shown as being connected to ground. CFG0–2 pins can be set, for example, to 000 in order to select the SPI03 mode to send the read command opcode 03, or to 100 in order to select the SPIX mode to send the programmable read command opcode to the PROM devices in parallel. In general, the configuration command embedded in the bitstream stored in the PROM device connected to the SISPI/D0 pin of the FPGA indicates how many boot PROMs are currently connected to the FPGA in a particular architecture.

In addition, FIG. 6 shows FPGA 602 having a pin DO, which can be used in configurations having two or more FPGAs connected in a daisy-chain fashion, to enable the configuration command and data to be bypassed or overflow to the next FPGA device in the daisy chain.

FIG. 6 also has an insert 610 showing a blown-up view of the portion of SPI interface 606 of FPGA 602 corresponding to the data input pins SOSPI/D0 to SOSPI/D7 and the configuration clock output pin CCLK. As shown in insert 610, SPI interface 606 has an 8:1 multiplexer (mux) 612 that serializes the eight different serial data streams received from the eight different PROMs 604 to generate serial bitstream 614, which is further appropriately distributed and processed within the FPGA to configure the FPGA using standard FPGA configuration processing.

As described previously, FPGA 602 can be connected to any number of boot PROMs from one to eight. Timing controller 616 generates a three-bit mux control signal 618 to control the operations of mux 612 to properly generate serial bitstream 614 from the serial data streams received from the existing boot PROMs. In one implementation, control signal 618 corresponds to bits 28, 29, and 30 of control register 0 in the FPGA. In general, control signal 618 is initialized to (000), which causes mux 612 to output serial data received at the SOSPI/D0 pin from PROM 604-0. Similarly, when the command is received by the FPGA to set control signal 618 is (001), mux 612 outputs serial data received at the SOSPI/D1 pin from PROM 604-1, and so on for the rest of the serial data received at and from the other pins and PROMs.

Timing controller 616 changes the value of mux control signal 618 based on (1) a local clock signal 620 generated by an internal oscillator (not shown) and (2) a counter setting 622 that is equal to the number of boot PROMs that are currently connected to the FPGA and which currently have configuration data to transmit to the FPGA. In addition, timing controller 616 generates the configuration clock signal CCLK, which is transmitted to the SCK pin of each boot PROM, as local clock signal 620 divided by counter setting 622.

For example, for the architecture of FIG. 6, in which eight boot PROMs simultaneously transmit serial data to the FPGA, timing controller 616 changes the value of mux control signal 618 at every cycle of local clock signal 620, e.g., to cycle through the eight different mux inputs in a sequential circular manner, while the configuration clock signal CCLK cycles once for every eight cycles of local clock signal 620. In this way, one bit from each boot PROM is interleaved by mux 612 to form one byte of serial bitstream 614 during every cycle of the configuration clock signal CCLK.

As another example, if FPGA 602 were connected to only four boot PROMs (e.g., at SOSPI/D0 though SOSPI/D3), then counter setting 622 would equal four, the configuration clock signal CCLK would cycle once for every four cycles of local clock signal 620, and one bit from each of the four boot PROMs would be interleaved by mux 612 to form four-bits of serial bitstream 614 during every cycle of the configuration clock signal CCLK.

This pattern can be analogously extended to architectures having the other numbers of boot PROMs (i.e., one, two, three, five, six, and seven), with appropriate dividing of the local clock signal and corresponding control over the mux. The present invention can also be extended to architectures having more than eight boot PROMs by using larger muxes and corresponding control algorithms.

In a preferred embodiment, a boot PROM is always connected to SOSPI/D0, any second boot PROM is connected to SOSPI/D1, any third boot PROM is connected to SOSPI/D2, and so on for however many boot PROMs there are. While this connection rule simplifies the implementation of timing controller 616, alternative embodiments having more complicated timing controllers may be able to support alternative connection schemes.

As mentioned previously, counter setting 622 identifies the number of boot PROMs that are currently connected to the FPGA and which currently have configuration data to transmit to the FPGA. In a preferred implementation, FPGA 602 is capable of (1) reading different amounts of configuration data from different boot PROMs and (2) being simultaneously connected to boot PROMs having different sizes. For example, assume that FPGA 602 can store up to three million bits of configuration data. In that case, FPGA 602 could be connected to a single standard-sized 4-Mbit SPI serial flash PROM that provides the configuration data to the FPGA, but this would involve a waste of 1 Mbits of capacity. Alternatively, FPGA 602 could be connected to three standard-sized 1-Mbit SPI serial flash PROMs, each of which provides ⅓ of the configuration data to the FPGA.

In another architecture, FPGA 602 is connected to one standard-sized 2-Mbit SPI serial flash PROM and one standard-sized 1-Mbit SPI serial flash PROM, where the 2-Mbit PROM stores ⅔ of the configuration data and the 1-Mbit PROM stores the rest (i.e., ⅓). In this case, with the 2-Mbit PROM connected to SOSPI/D0 and the 1-Mbit PROM connected to SOSPI/D1, FPGA 602 could initially read and interleave data from both boot PROMs for the first 2 Mbits of configuration data and then change its clock timing and mux control to read the last 1 Mbits of configuration data from only the 2-Mbit PROM. In this way, FPGA 602 can be efficiently configured using a minimal number of standard-sized boot PROMs.

Although FPGA 602 can be connected simultaneously to two of more boot PROMs of different sizes and storing different amounts of data, it is also possible to (1) connect FPGA 602 to two or more boot PROMs of the same size, which store different amounts of data or (2) connect FPGA 602 to two or more boot PROMs of different sizes, which nevertheless store the same amount of data.

In a preferred embodiment, the value for counter setting 622 is based on the configuration mode signal CFG and from information contained in the configuration data stored in the different boot PROMs. For example, FPGA 602 may be designed to initially read data from only the first boot PROM. Information encoded in that data instructs the FPGA when to begin to read data from other connected boot PROMs, if any (as indicated by the configuration mode signal CFG). Similarly, information encoded in subsequent configuration data can be used to inform the FPGA when one or more of the boot PROMs are running out of configuration data to transmit.

In a preferred implementation of FPGA 602, larger boot PROMs and/or boot PROMs having more configuration data are connected to lower numbered data bits (e.g., SOSPI/D0, rather than SOSPI/D7), although this is not necessarily required for all implementations.

Figure 7:
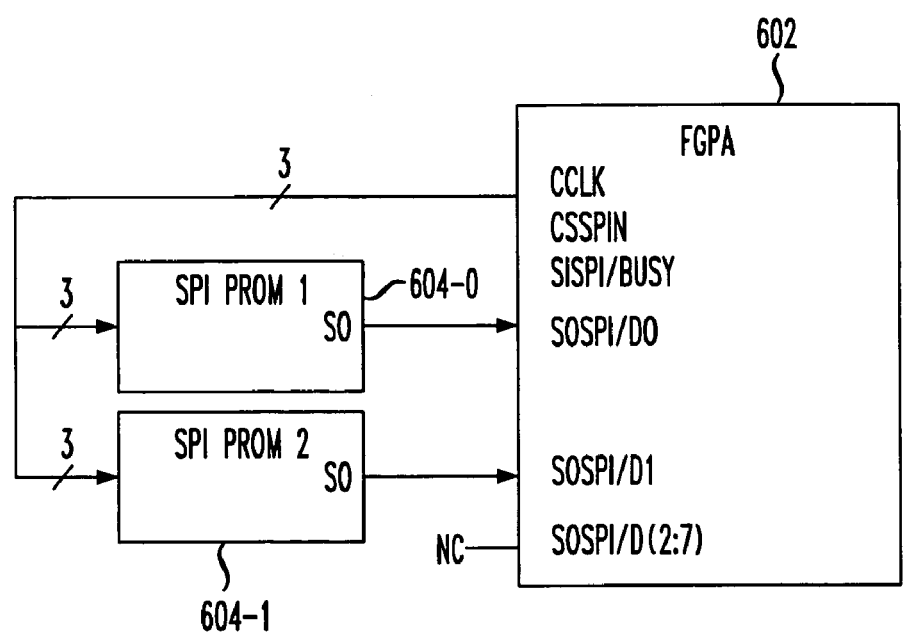
FIG. 7 shows a block diagram of an architecture for configuring the FPGA of FIG. 6, when the FPGA is connected to only a pair of SPI serial flash PROMs.

FIG. 7 shows a block diagram of an architecture for configuring FPGA 602 of FIG. 6, when FPGA 602 is connected to only a pair of SPI serial flash PROM devices 604-0 and 604-1. In this case, the SOSPI/D0 pin of FPGA 602 is connected to receive data from the SO pin of PROM 604-0 and the SOSPI/D1 pin of FPGA 602 is connected to receive data from the SO pin of PROM 604-1, while the SOSPI/D2–7 are not connected (NC) to any boot PROMs. In this case, mux 612 of FIG. 6 interleaves the configuration data from the two PROMs to generate the serial bitstream used to configure the FPGA.

Although not necessarily depicted in FIG. 7, FPGA 602 and each PROM 604 has all of the analogous connections shown for the FPGAs and PROMs of FIGS. 4 and 6. For example, in this case, FPGA 602 would receive a configuration mode signal CFG of (001) to indicate that the FPGA is connected to two PROMs.

Figure 8:
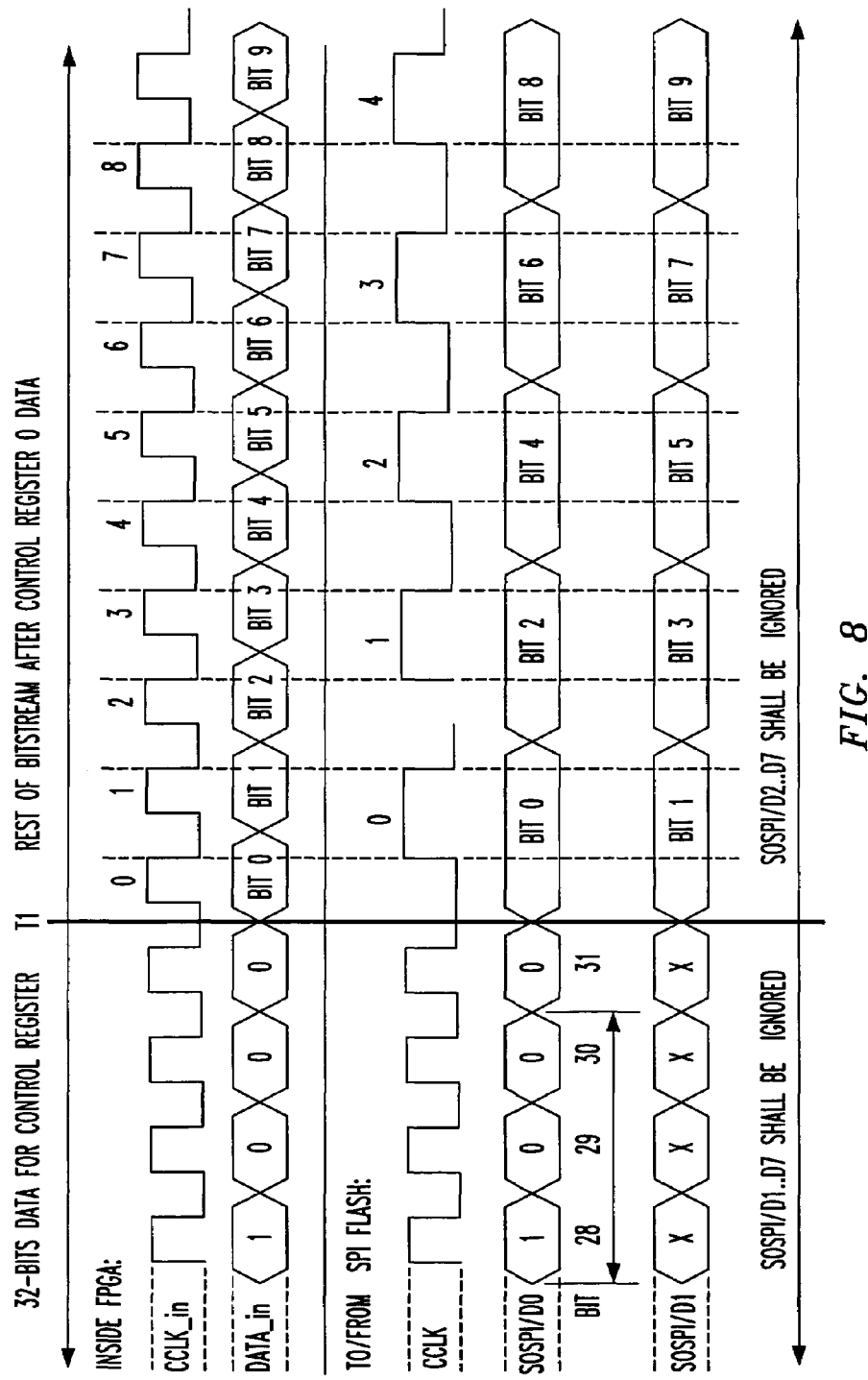
FIG. 8. shows a signal timing diagram for a portion of a boot cycle for the architecture of FIG. 7.

FIG. 8. shows a signal timing diagram for a portion of a boot cycle for the architecture of FIG. 7. In FIG. 8, CCLK_int corresponds to local clock signal 620 of FIG. 6. Similarly, DATA_int corresponds to serial bitstream 614 of FIG. 6.

As indicated in FIG. 8, after FPGA 602 sends the read command and the starting address to the two boot PROMs 604-0 and 604-1 in parallel via SISPI/BUSY (similar to the processing represented in FIG. 5), the FPGA begins by reading the data coming out of only one boot PROM (604-0 in this implementation). Any data coming out of the other boot PROM 604-1 is ignored until the command not to ignore it (i.e., SISPI/BUSY going from low to tristated as in FIG. 5) is received.

This initial processing of only boot PROM 604-0 data is represented in FIG. 8 prior to time T1. As shown in FIG. 8, during this initial time period, the configuration clock signal CCLK sent from the FPGA to both boot PROMs is set equal to the internal clock CCLK_int. In response, both boot PROMs transmit data to the FPGA at that clock rate, but, by appropriately controlling mux 612, the data from only PROM 604-0 (i.e., SOSPI/D0) is used to generate the internal serial bitstream DATA_int, while the data from PROM 604-1 (i.e., SOSPI/D1) is ignored.

FIG. 8 represents the last four bits (i.e., Bits 28–31) of a 32-bit (in this particular example) control signal transmitted from PROM 604-0 to the FPGA during this initial time period. This control signal, which is immediately interpreted by the FPGA, has embedded within it the command to instruct the FPGA to start processing (in this case, at time T1) the bitstream(s) coming out of the rest of the boot PROMs in the architecture (in this case, the one other bitstream coming out of the one other boot PROM 604-1). Time T1 of FIG. 8 is analogous to the start of clock cycle #128 in FIG. 5.

Thus, at time T1, based on the fact that the configuration control mode signal CFG indicated that there are two boot PROMs, the FPGA changes the rate of the configuration clock signal CCLK to be half the rate of its internal clock signal CCLK_int. This causes the two boot PROMs to begin to transmit configuration data at half the rate as they did before time T1.

Similar to the processing described previously for FIG. 6, mux 612 within FPGA 602 receives data from both boot PROMs and interleaves then at the bit level to generate the internal serial bitstream DATA_int. As represented in FIG. 8, boot PROM 604-0 stores all of the even numbered configuration data bits, while boot PROM 604-1 stores all of the odd numbered configuration data bits. In response to CCLK clock cycle #0, PROM 604-0 transmits configuration data Bit 0 to the FPGA at the same time that PROM 604-1 transmits configuration data Bit 1 to the FPGA. During CCLK_int clock cycle #0, the mux passes Bit 0 received from SOSPI/D0 to DATA_int. Then, during CCLK_int clock cycle #1, the mux passes Bit 1 received from SOSPI/D1 to DATA_int. This data interleaving process continues as long as there is valid configuration data transmitted from both boot PROMs. (Note that, as indicated in FIG. 8, the FPGA's six other boot PROM data input pins (i.e., SOSPI/D2–D7) are ignored throughout the boot cycle.)

If boot PROM 604-1 stores less configuration data then boot PROM 604-0, then the data from PROM 604-1 will be exhausted ahead of the data from PROM 604-0. In that case (not represented in FIG. 8), the configuration data will contain control data to instruct the FPGA to stop processing data from PROM 604-1. When that occurs, the FPGA will return the configuration clock signal CCLK back to its original rate and the FPGA's mux will return to passing data from only PROM 604-0 on to DATA_int.

In general, the FPGA can be controlled to include or exclude data from any one or any combination of boot PROMs in the serialization process. As described previously, in this way, the FPGA can selectively stop reading from a boot PROM when all the configuration data stored in that particular PROM has been transferred to the FPGA. This capability enables the FPGA to be connected simultaneously to multiple boot PROMs having different sizes (or densities). For example, if the configuration bitstream for an FPGA is three million bits, but the standard sizes of PROMs are 1 Mbits, 2 Mbits, and 4 Mbits, then the FPGA configuration architecture can be efficiently implemented using two standard-sized PROMs as its multiple boot PROMs: a 1 Mbit PROM and a 2 Mbit PROM. This solution may be more advantageous that either (1) a single-PROM architecture that uses a single 4 Mbit PROM (which wastes 1 Mbits of capacity) or (2) a three-PROM architecture that uses three 1 Mbit PROMs (which has a higher device count).

In any case, after the FPGA has received all of its configuration data from the boot PROMs, the FPGA will terminate communication with all of the boot PROMs by driving the chip select signal CSSPIN high to disable all of the boot PROMs.

Although the present invention has been described in the context of bit-level interleaving of configuration data from different boot PROMs, those skilled in the art will understand that, in alternative embodiments, the interleaving can be implemented at levels other than a single bit (e.g., at a byte level). Such embodiments might have different timing characteristics and might need to provide buffering of configuration data prior to the actual interleaving.

Although the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device that requires configuration data.

Although the present invention has been described in the context of embodiments in which serial PROMs are used to store configuration data, in other embodiments, other types of memory devices can be used, including (1) other types of serial memory devices, such as serial random access memory (RAM) devices, and (2) even non-serial memory devices. For example, in theory, the present invention could be implemented using two or more parallel memory devices to store configuration data, where each memory device has two (or more) parallel output data pins that get connected directly to a corresponding number of pins on the programmable device being configured.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A programmable logic device (PLD) comprising a serial data interface, the serial data interface including:
   a first pin adapted to transmit a chip select signal from within the PLD directly to a first pin of a serial PROM;
   a second pin adapted to transmit a configuration clock signal from within the PLD directly to a second pin of the serial PROM;
   a third pin adapted to transmit a read command and an address signal from within the PLD directly to a third pin of the serial PROM, and
   a fourth pin adapted to receive a configuration bitstream directly from a fourth pin of the serial PROM,
   the PLD including one or more of the following configuration modes:
      a first configuration mode wherein the read command transmitted from the third pin is hardwired within the PLD; and
      a second configuration mode wherein the read command transmitted from the third pin is user programmable within the PLD.

2. The PLD of claim 1, wherein the serial data interface conforms to a Serial Peripheral Interface (SPI) standard.

3. The PLD of claim 2, wherein the serial PROM is a flash PROM that conforms to the SPI standard.

4. The PLD of claim 1, wherein the serial data interface further includes a fifth pin adapted to transmit an initialization signal from the PLD directly to a fifth pin of the serial PROM.

5. The PLD of claim 1, wherein the serial data interface is implemented with dedicated circuitry within the PLD.

6. The PLD of claim 1, wherein the serial data interface is implemented with programmable logic within the PLD.

7. The PLD of claim 1, wherein the serial data interface is adapted to transmit sequentially to the serial PROM the chip select signal, the read command, the address signal, and the configuration clock signal, and to receive in response from the serial PROM the configuration bitstream.

8. The PLD of claim 1, wherein the PLD is an FPGA.

9. An apparatus comprising:
   a serial flash PROM comprising a serial data interface, the serial data interface including:
      a first pin adapted to receive a chip select signal;
      a second pin adapted to receive a configuration clock signal;
      a third pin adapted to receive a read command and an address signal; and
      a fourth pin adapted to transmit a configuration bitstream in response to the read command and address signal; and
   a programmable logic device (PLD) comprising a serial data interface, the serial data interface including:
      a first pin adapted to transmit the chip select signal from within the PLD directly to the first pin of the serial flash PROM;
      a second pin adapted to transmit the configuration clock signal from within the PLD directly to the second pin of the serial flash PROM;
      a third pin adapted to transmit the read command and the address signal from within the PLD directly to the third pin of the serial flash PROM, and
      a fourth pin adapted to receive the configuration bitstream directly from the fourth pin of the serial flash PROM,
      the PLD including a first configuration mode wherein the read command transmitted from the third pin is user programmable within the PLD.

10. The apparatus of claim 9, wherein the serial data interfaces of the PLD and serial flash PROM conform to a Serial Peripheral Interface (SPI) standard.

11. The apparatus of claim 9, wherein the serial data interface of the PLD and the serial data interface of the serial flash PROM each further includes a fifth pin, the fifth pin of the PLD adapted to transmit an initialization signal from the PLD directly to the fifth pin of the serial PROM.

12. The apparatus of claim 9, wherein the serial data interface of the PLD is implemented with dedicated circuitry within the PLD.

13. The apparatus of claim 9, wherein the serial data interface of the PLD is implemented with programmable logic within the PLD.

14. The apparatus of claim 9, wherein the serial data interface of the PLD is adapted to transmit sequentially to the serial data interface of the serial flash PROM the chip select signal, the read command, the address signal, and the configuration clock signal, and to receive in response from the serial data interface of the serial flash PROM the configuration bitstream.

15. The apparatus of claim 9, wherein the PLD is an FPGA.

16. The PLD of claim 1, wherein the hardwired read command is a multi-bit opcode.

17. The PLD of claim 1, wherein the PLD includes both the first and second configuration modes.

18. The PLD of claim 17, including one or more additional pins adapted to receive the user programmable read command.

19. The PLD of claim 1, wherein the first configuration mode is an SPI03 mode and the second configuration mode is an SPIX mode.

20. The PLD of claim 9 including one or more additional pins adapted to receive the user programmable read command.

21. The PLD of claim 9, wherein the user programmable read command is a multi-bit opcode.

22. The apparatus of claim 9, in which the PLD includes a second configuration mode wherein the read command transmitted from the third pin is hardwired within the PLD.

23. The apparatus of claim 22, wherein the first configuration mode is an SPIX mode and the second configuration mode is an SPI03 mode.

24. A programmable logic device (PLD) comprising a serial data interface, the serial data interface including:
   a first pin adapted to transmit a chip select signal from within the PLD directly to a first pin of a serial PROM;
   a second pin adapted to transmit a configuration clock signal from within the PLD directly to a second pin of the serial PROM;
   a third pin adapted to transmit a read command and an address signal from within the PLD directly to a third pin of the serial PROM, and
   a fourth pin adapted to receive a configuration bitstream directly from a fourth pin of the serial PROM,
   the PLD including a first configuration mode wherein the read command transmitted from the third pin is hardwired within the PLD.

25. The PLD of claim 24, wherein the hardwired read command is a multi-bit opcode.

26. The PLD of claim 24, in which the PLD includes a second configuration mode wherein the read command transmitted from the third pin is user programmable within the PLD.

27. The PLD of claim 26 including one or more additional pins adapted to receive the user programmable read command.

28. The PLD of claim 26, wherein the first configuration mode is an SPI03 mode and the second configuration mode is an SPIX mode.

29. The PLD of claim 24, wherein the serial data interface is implemented with dedicated circuitry within the PLD.

30. The PLD of claim 24, wherein the serial data interface is implemented with programmable logic within the PLD.

31. The PLD of claim 24, wherein the PLD is an FPGA.

32. A programmble logic device (PLD) comprising a serial data interface, the serial data interface including:
   a first pin adapted to transmit a chip select signal from within the PLD directly to a first pin of a serial PROM;
   a second pin adapted to transmit a configuration clock signal from within the PLD directly to a second pin of the serial PROM;
   a third pin adapted to transmit a read command and an address signal from within the PLD directly to a third pin of the serial PROM, and
   a fourth pin adapted to receive a configuration bitstream directly from a fourth pin of the serial PROM,
   the PLD including a first configuration mode wherein the read command transmitted from the third pin is user programmable within the PLD.

33. The PLD of claim 32 including one or more additional pins adapted to receive the user programmable read command.

34. The PLD of claim 32, wherein the user programmable read command is a multi-bit opcode.

35. The PLD of claim 32, wherein the serial data interface is implemented with dedicated circuitry within the PLD.

36. The PLD of claim 32, wherein the serial data interface is implemented with programmable logic within the PLD.

37. The PLD of claim 32, wherein the PLD is an FPGA.

* * * * *